(12) United States Patent
Pfirsch

(10) Patent No.: US 7,492,034 B2
(45) Date of Patent: Feb. 17, 2009

(54) SEMICONDUCTOR DEVICE

(75) Inventor: Frank Pfirsch, Munich (DE)

(73) Assignee: Infineon Technologies AG, Munich (DE)

( * ) Notice: Subject to any disclaimer, the term of this patent is extended or adjusted under 35 U.S.C. 154(b) by 126 days.

(21) Appl. No.: 11/224,680

(22) Filed: Sep. 12, 2005

(65) Prior Publication Data

US 2006/0081964 A1   Apr. 20, 2006

(30) Foreign Application Priority Data

Sep. 3, 2004   (DE) .................. 10 2004 042 758

(51) Int. Cl.
*H01L 29/739* (2006.01)
*H01L 29/745* (2006.01)

(52) U.S. Cl. .............. 257/591; 257/331; 257/565; 257/655; 257/E29.201; 257/E29.214

(58) Field of Classification Search .............. None
See application file for complete search history.

(56) References Cited

U.S. PATENT DOCUMENTS

| | | | |
|---|---|---|---|
| 5,298,780 A | | 3/1994 | Harada |
| 5,323,040 A | * | 6/1994 | Baliga ................. 257/332 |
| 5,430,323 A | | 7/1995 | Yamazaki et al. |
| 5,929,481 A | * | 7/1999 | Hshieh et al. ............... 257/328 |
| 2001/0026977 A1 | * | 10/2001 | Hattori et al. ............... 438/268 |
| 2002/0177277 A1 | * | 11/2002 | Baliga ....................... 438/268 |

FOREIGN PATENT DOCUMENTS

| | | |
|---|---|---|
| DE | 100 07 416 C1 | 6/2001 |
| DE | 100 48 857 A1 | 4/2002 |
| DE | 103 08 313 A1 | 9/2004 |
| EP | 0 564 094 A2 | 10/1993 |
| WO | WO 2004/077573 A2 | 9/2004 |
| WO | WO 2004/077573 A3 | 9/2004 |

* cited by examiner

*Primary Examiner*—Andy Huynh
*Assistant Examiner*—Hoang-Quan T Ho
(74) *Attorney, Agent, or Firm*—Maginot, Moore & Beck

(57) ABSTRACT

A semiconductor device (1, 20-80) has an emitter terminal (2), a collector terminal (3) and also a semiconductor body (4) provided between emitter terminal (2) and collector terminal (3). An emitter zone (5, 70) is formed in the semiconductor body (4), said emitter zone at least partially adjoining the emitter terminal (2) and also having a first interface (16) facing the emitter terminal (2) and a second interface (17) facing the collector terminal. The semiconductor device has at least one MOS structure (8, 81) which pervades the emitter zone or adjoins the latter, and which is configured such that corresponding MOS channels (11, 14) induced by the MOS structure (8, 81) within the emitter zone (5, 70) are at a distance from the first interface (16) of the emitter zone (5, 70).

7 Claims, 9 Drawing Sheets

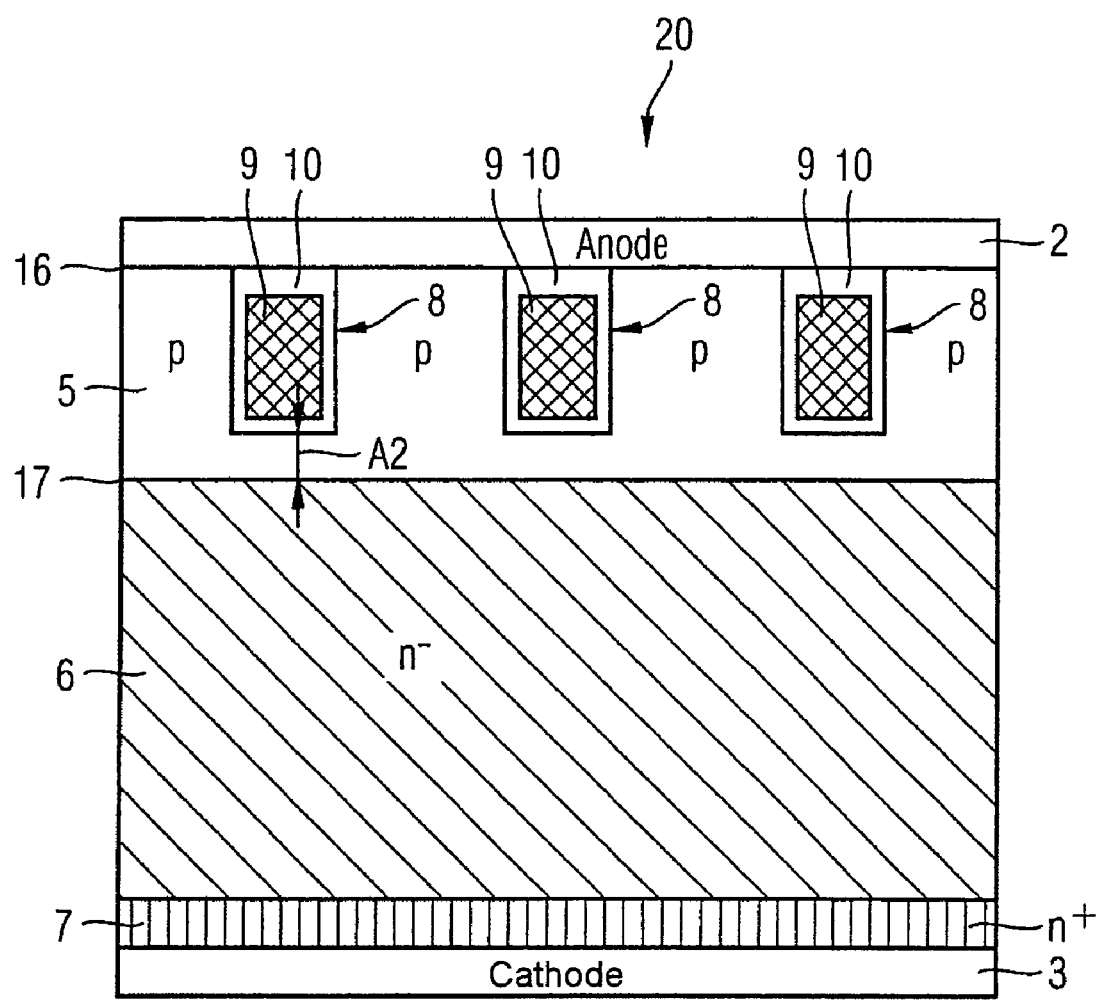

SEMICONDUCTOR DEVICE

The invention relates to a semiconductor device, in particular a bipolar semiconductor device, which has an emitter terminal, a collector terminal and also a semiconductor body provided between emitter terminal and collector terminal, an emitter zone being formed within the semiconductor body, said emitter zone at least partially adjoining the emitter terminal.

Bipolar semiconductor devices have a low forward resistance if the charge carrier flooding in the semiconductor body of the device is high, it being possible for the intensity of the charge carrier flooding to be set in particular by means of the efficiency of the emitter zone formed in the semiconductor body. A high charge carrier flooding has the disadvantage, however, that high reverse currents occur during switching operations of the semiconductor device, for example during the commutation of power diodes, said high reverse currents being undesirable since they lead to increased switching losses.

This problem can be tackled by actively controlling the efficiency of the emitter zone. The document DE 100 48 857 A1 describes a power diode, for example, in which the efficiency of the emitter zone (p-type emitter) can be reduced by switching on an n-MOS channel. Switching on the n-MOS channel has the effect that electrons coming from the collector terminal can pass via the n-MOS channel into an $n^+$-type region connected to the emitter terminal, and from said region to the emitter terminal. Since the n-MOS channel is formed in a region of low p-type doping, the efficiency of the emitter zone is low when the n-MOS channel is switched on, which results in a low charge carrier flooding. If the n-MOS channel is switched off, by contrast, the electrons coming from the collector terminal have to flow through a region of higher p-type doping, which results in an increased efficiency of the emitter zone and hence a higher charge carrier flooding.

In order nevertheless to obtain low reverse current intensities in conjunction with a low forward resistance, in the on state of the power diode the n-MOS channel is switched off (high charge carrier flooding), but is switched on shortly before the commutation of the power diode (low charge carrier flooding). What is disadvantageous in this case is that a parasitic npn transistor can be activated during the commutation, which in the worst case entails a destruction of the power diode.

The document DE 100 07 416 C1 shows a power diode in which electrons can reach an NMOS transistor via a Schottky contact and in turn an emitter terminal via said transistor. In the power diode, it is likewise possible to set the intensity of the charge carrier flooding and thus to obtain a reduction of the reverse current. However, a parasitic npn transistor can be activated in an undesired manner in this case, too. Furthermore, the process for producing such a power diode is complicated.

In this connection, reference shall furthermore be made to the documents U.S. Pat. No. 5,430,323 and EP 0 564 094 B1, which describe power diodes having similar disadvantages.

The object on which the invention is based is to specify a semiconductor device by means of which the abovementioned problems can be avoided, that is to say by means of which uniformly low forward resistances and low reverse currents can be obtained without there being the risk of activating parasitic transistors.

In order to achieve the object, the invention provides a semiconductor device in accordance with Patent claim 1. Advantageous refinements or developments of the concept of the invention are found in the subclaims.

The semiconductor device according to the invention has an emitter terminal, a collector terminal and also a semiconductor body provided between emitter terminal and collector terminal. An emitter zone of the first conductivity type is formed in the semiconductor body. The emitter zone has a first interface facing the emitter terminal, and a second interface facing the collector terminal. The first interface adjoins the emitter terminal or a first semiconductor region—contact-connected with the first emitter terminal—of the second conductivity type, which is complementary to the first conductivity type. The emitter zone is pervaded by at least one MOS structure or adjoins at least one MOS structure. The MOS structure is configured such that corresponding MOS channels induced by the MOS structure within the emitter region are at a distance from the first interface of the emitter zone.

The emitter zone may be a p-type emitter or an n-type emitter in this case. Here, "emitter terminal" is to be understood to be a terminal which makes electrical contact with the emitter zone, and "collector terminal" means a terminal which, compared with the emitter terminal, is at a further distance from the emitter zone. Thus, this "emitter terminal" may be understood to be for example the anode terminal of a diode or the collector terminal of an IGBT (Insulated Gate Bipolar Transistor).

In this case, the term "first interface" is understood to be a junction between the emitter zone and the emitter terminal or between the emitter zone and a semiconductor region which is connected to the emitter terminal and has the opposite doping type to that of the emitter zone. Analogously to this, the term "second interface" is understood to be a junction between the emitter zone and the rest of the semiconductor body facing the collector terminal. The term "interface" does not include junctions between semiconductor body and insulation layers.

Accordingly, one important aspect of the invention is to configure the MOS structures such that through the MOS channels induced by the MOS structures, although large parts of the emitter zone are made "transmissive" for electrons, no direct connections are produced between the emitter terminal and the semiconductor region adjoining the second interface of the emitter zone, that is to say that the emitter zone is not completely bridged by a MOS channel. Spacing apart the MOS channels from the emitter terminal has the advantage that no parasitic transistors can be activated.

If the emitter zone is configured as a p-type emitter, then electrons coming from the collector terminal, by means of the MOS structure, can be "locked" in the direction of the emitter terminal through a large part of the emitter zone. Since the MOS channel does not adjoin the emitter terminal, but rather is at a distance from the latter, the electrons have to diffuse from an end section of the MOS channel as far as the emitter terminal as minority charge carriers. By contrast, in the case of commutation, an electron current having the opposite flow direction can be suppressed, that is to say that no parasitic npn transistor can be activated in the semiconductor device.

In a preferred embodiment, the dopant concentration within the MOS channels is higher than the dopant concentration between the first interface of the emitter zone and the end sections of the MOS channels that face the first interface.

As already mentioned, the inducible MOS channels should "bridge" a largest possible portion of the emitter zone, but not the entire emitter zone. In a preferred embodiment, therefore, the relation:

$$M2 < M1/2 \text{ or } M2 < M1/5$$

should be fulfilled. In this case, M1 represents the minimum of a dopant quantity which can be obtained upon integration of the dopant concentration along an arbitrary path from the first interface to the second interface of the emitter zone. M2 represents the minimum of a dopant quantity which can be obtained upon integration of the dopant concentration along an overall path. In this case, the overall path is composed of a) an arbitrary path from the second interface to a MOS channel, and b) an arbitrary path from the first interface to a section of the MOS channel that is closest to the first interface.

Generally, the relation:

$$M2 < M1/X$$

should be fulfilled, where X is in a range of 2 to 5.

As already mentioned, a first highly doped semiconductor region may be formed within the emitter zone, said semiconductor region being directly connected to the emitter terminal, and the doping type of said semiconductor region being complementary to the doping type of the emitter zone. In this case, the first highly doped semiconductor region is at a distance from the MOS channels in a defined manner. If the first highly doped semiconductor region is configured as an $n^+$-doped region, for example, then the electron current flowing through a MOS channel can be conducted away effectively to the emitter terminal after diffusion via the defined distance via said region.

Furthermore, a second highly doped semiconductor region may be formed within the emitter zone, said semiconductor region being directly connected to the emitter terminal, and the doping type of said semiconductor region corresponding to that of the emitter zone, the second highly doped semiconductor region being at a distance from the MOS channels and being arranged directly below or beside the first semiconductor region or adjoining the first semiconductor region. The second highly doped semiconductor region may serve, given corresponding configuration (a $p^+$-doping), for effectively feeding, during the switching (commutation) of the semiconductor device, a hole current to the emitter terminal, which can thus no longer activate the parasitic npn/pnp transistor comprising first highly doped semiconductor region, emitter zone and collector.

The semiconductor device may have a vertical or horizontal construction, it being possible for the inducible MOS channels to be oriented both laterally and vertically.

The concept according to the invention can be applied particularly advantageously to a power diode. However, the invention is not restricted thereto, rather the concept according to the invention can also be employed in any other semiconductor devices, for example an IGBT, a thyristor, a GTO (Gate Turn-off Thyristor) an EST (Emitter Switched Thyristor) or an MCT (MOS Controlled Thyristor).

The invention is explained in more detail below in exemplary embodiment with reference to the figures, in which:

FIG. 3 shows a second embodiment of the semiconductor device according to the invention in a cross-sectional illustration.

In the figures, identical or mutually corresponding regions, structural parts or groups of structural parts are identified by the same reference numerals. Furthermore, all embodiments may be doped inversely, that is to say that n-type regions and p-type regions may be interchanged with one another.

Figure 1:
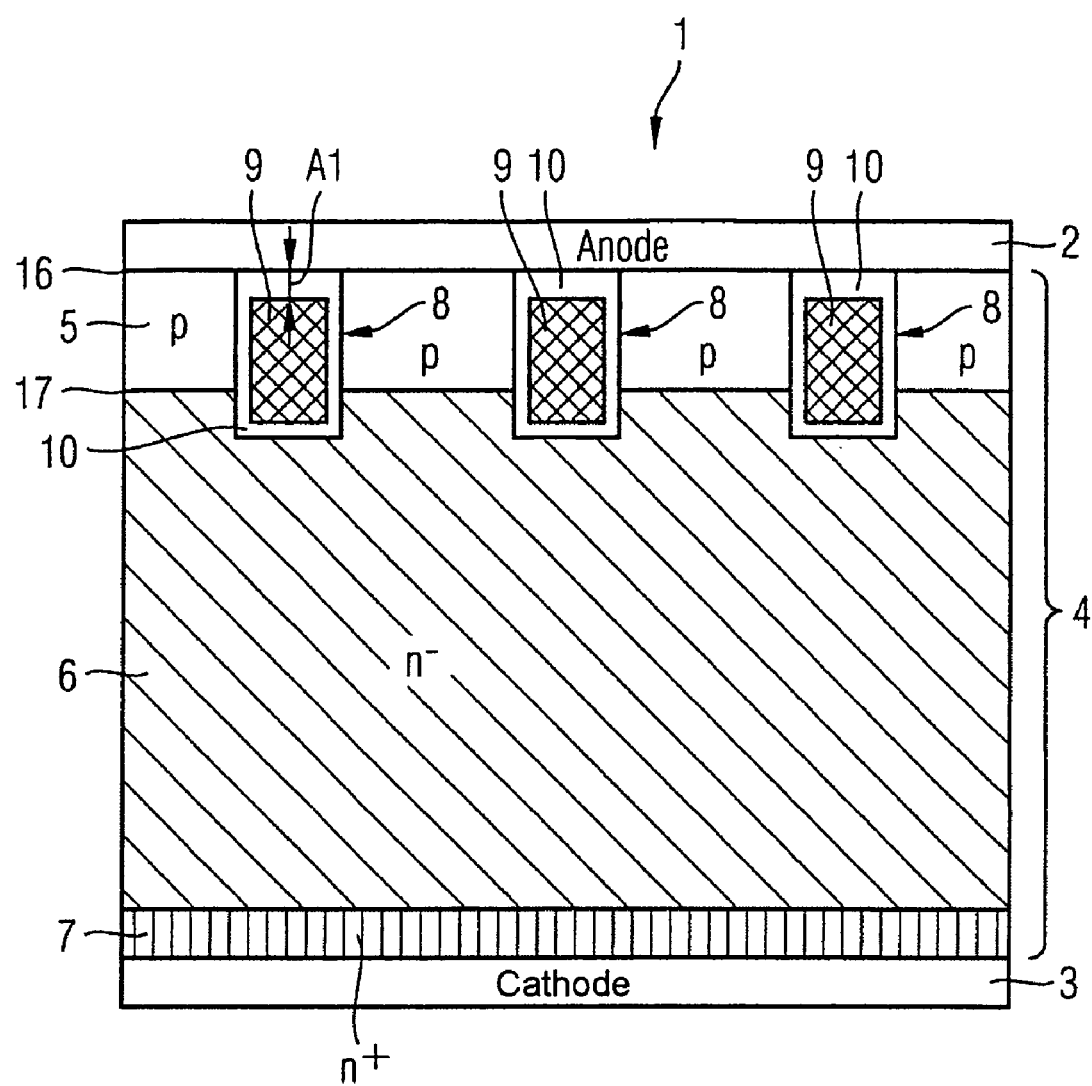
FIG. 1 shows a first embodiment of the semiconductor device according to the invention in a cross-sectional illustration.

A first embodiment of a semiconductor device according to the invention can be seen in FIG. 1.

A power diode 1 has an emitter terminal 2, a collector terminal 3 and a semiconductor body 4 provided between emitter terminal 2 and collector terminal 3. The semiconductor body 4 has a p-doped emitter zone 5, an $n^-$-doped drift region 6 and also an $n^+$-doped region 7 adjoining the collector terminal. The emitter zone 5 is pervaded by MOS structures 8, each MOS structure 8 having a gate 9 and also an insulation layer 10 that insulates the gate 9.

The MOS structures 8 project into the drift region 6 the gates 9 being spaced apart from the emitter terminal 2 by a distance A1. The distance A1 has the effect that MOS channels that can be produced through the MOS structures 8 within the p-doped emitter zone 5 can likewise extend towards the emitter terminal 2 only as close as the distance A1. In this way, it is possible to suppress electron currents from the emitter terminal 2 to the collector terminal 3.

Figure 2:
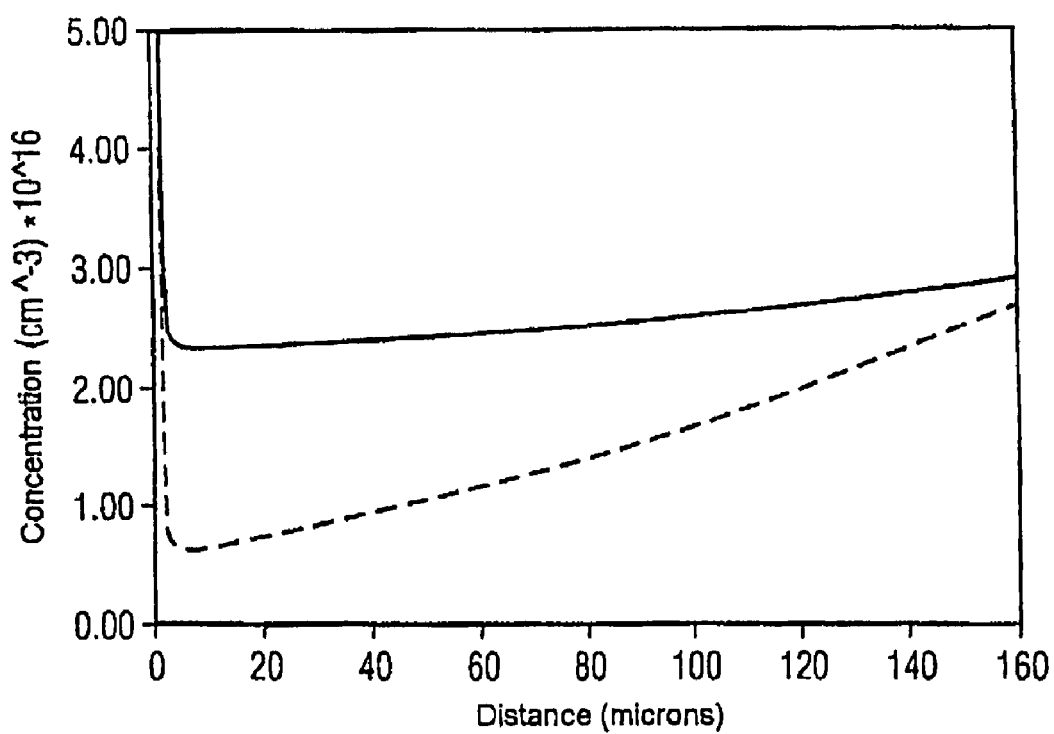
FIG. 2 shows the charge carrier distribution for the embodiment shown in FIG. 1 with the gate switched on and off.

FIG. 2 shows the charge carrier distribution (holes) at a gate voltage of 0 V (solid line) and at a gate voltage of 15 V (dashed line) within the emitter zone 5. In this case, the abscissa designates the distance to the emitter terminal in the vertical direction.

FIG. 3 shows a second embodiment of the semiconductor device according to the invention.

A power diode 20 essentially has the same construction as the power diode 1 from FIG. 1, but with the difference that the MOS structures 8 do not adjoin the $n^-$-doped drift region 6, but rather are spaced apart from the latter by a distance A2. The MOS structures 8 thus lie completely within the emitter zones 5.

Figure 4A:
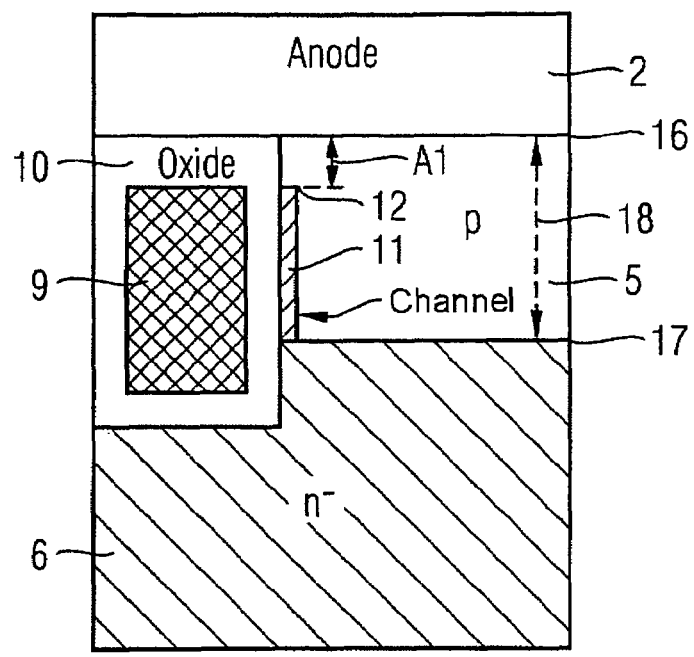
FIG. 4a shows a detail from the first embodiment shown in FIG. 1.

FIG. 4a illustrates a detail from the semiconductor device shown in FIG. 1. It can be discerned here that a MOS channel 11 induced by the gate 9 in the emitter zone pervades only part of the emitter zone 5: an end 12 of the MOS channel 11 that faces the emitter terminal is spaced apart from the emitter terminal 2 by the distance A1.

Figure 4B:
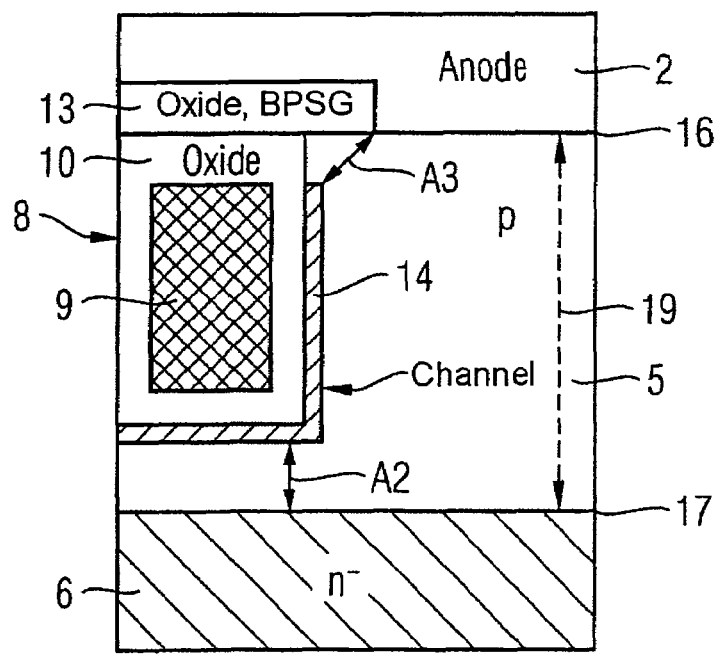
FIG. 4b shows a detail from the second embodiment shown in FIG. 3.

FIG. 4b illustrates a detail from the embodiment shown in FIG. 3, an insulation layer 13 additionally being provided, said insulation layer being arranged between the MOS structure 8 and the emitter terminal 2. A MOS channel 14 that can be produced by the MOS structure within the emitter zone 5 is spaced apart from the drift region 6 by a distance A2, and from the emitter terminal 2 by a distance A3. To put it more precisely, the distance A3 represents the shortest possible connection between a channel end 15 of the MOS channel 14 that faces the emitter terminal 2 and the emitter terminal 2. This distance may proceed in the vertical, lateral, or as shown here, oblique direction.

The following relation should preferably be fulfilled:

$$M2 < M1/2 \text{ or } M2 < M1/5,$$

where M1 is the minimum of a dopant quantity which can be obtained upon integration of the dopant concentration along an arbitrary path from a first interface 16 to a second interface 17 of the emitter zone 5, and M2 is the minimum of a dopant quantity which can be obtained upon integration of the dopant concentration along an overall path composed of a) an arbitrary path from the second interface 17 to a MOS channel, and b) an arbitrary path from the first interface 16 to a section of the MOS channel that is closest to the first interface 16.

Referring to FIG. 4a, the minimum M1 would be obtained if the dopant concentration were integrated along a path 18. The minimum M2 would be obtained if the dopant concentration were integrated along the distance A1.

Analogously to this, in FIG. 4b, the minimum M1 of the dopant quantity would be obtainable along the integration path 19, and the minimum M2 of the dopant quantity along an overall path composed of the distance A2 and the distance A3.

Figure 5:
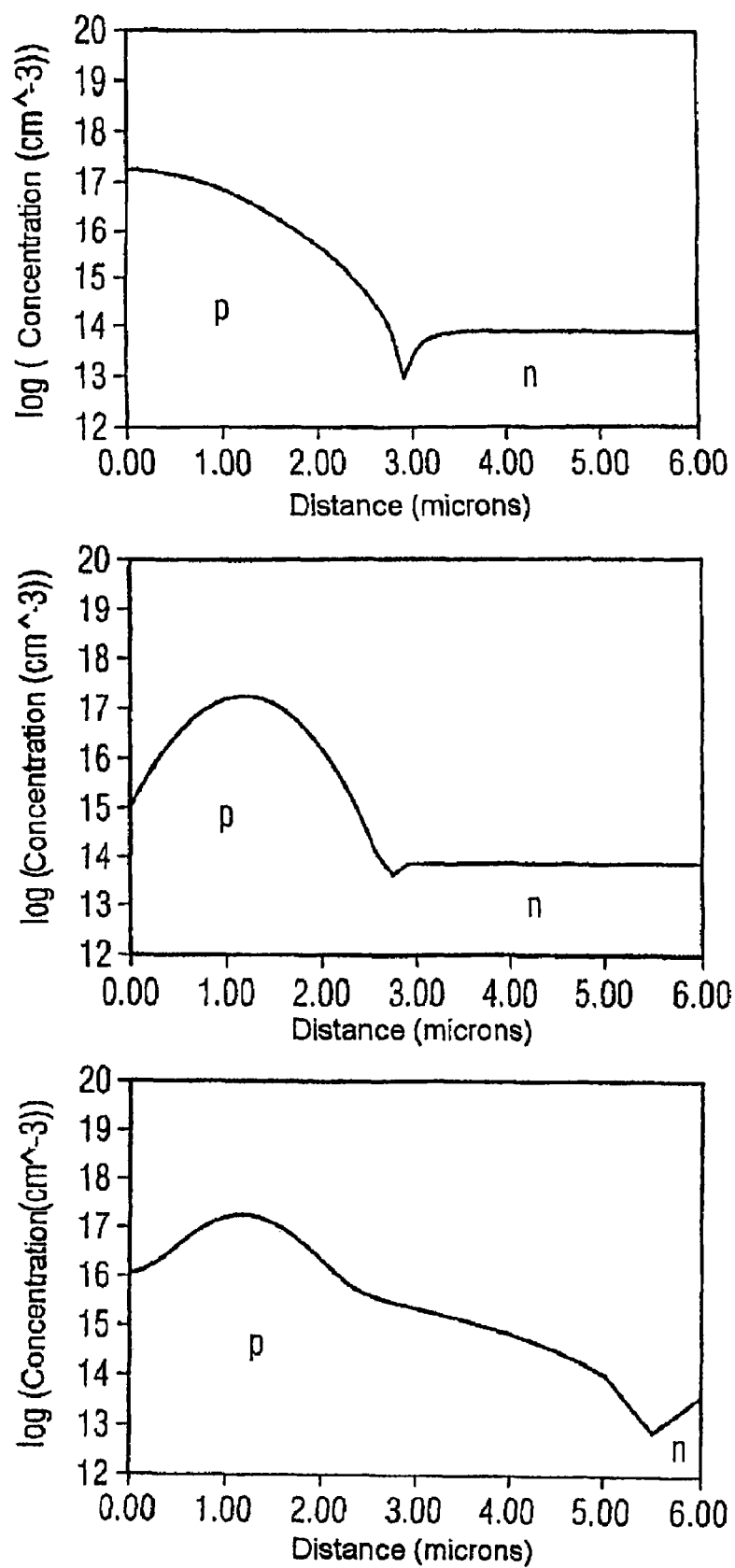
FIG. 5 shows preferred doping profiles of the emitter zone and of the adjacent semiconductor region in a semiconductor device according to the invention.

FIG. 5 shows three possible doping profiles of the emitter zone 5 and also of the adjoining drift region 6. The upper doping profile is not preferable since the p-type doping has the maximum in the vicinity of the emitter terminal. It is better, as shown in the middle and lower doping profiles, for the maximum of the p-doping within the emitter zone 5 to be placed in the centre, so that between the induced MOS channels and the emitter terminal the doping turns out to be low.

If it is assumed that the depth of the trenches in which the gates 9 are formed is 4 μm, then the middle doping profile corresponds to a preferred doping profile for the embodiment shown in FIG. 1, and the lower doping profile corresponds to a preferred doping profile for the embodiment shown in FIG. 3.

Figure 6:
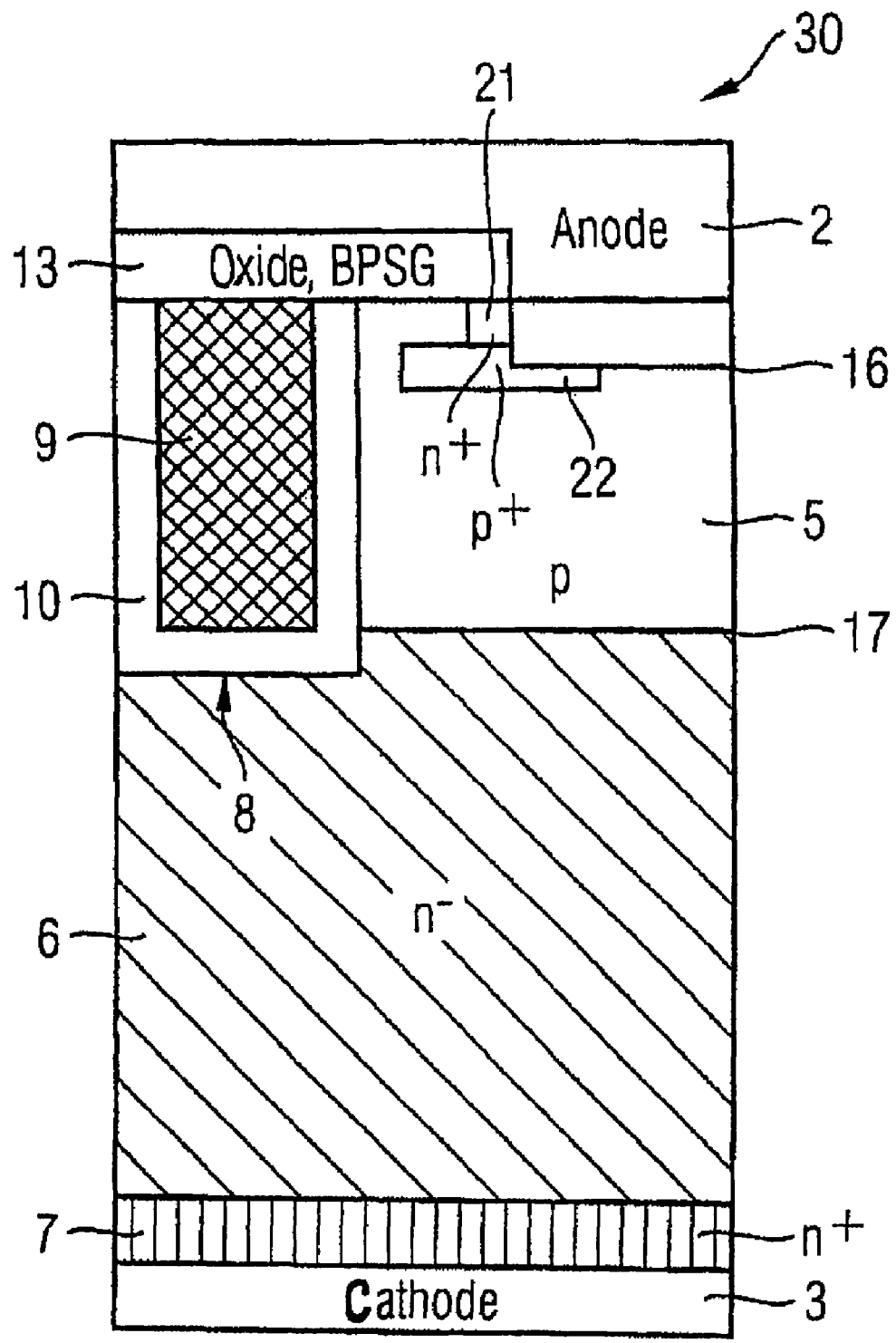
FIG. 6 shows a third embodiment of the semiconductor device according to the invention in a cross-sectional illustration.

FIG. 6 shows a further possible embodiment of the semiconductor device according to the invention. The construction of a power diode 30 essentially corresponds to the construction of the power diode 1 shown in FIG. 1, but with the difference that an insulation layer 13 is provided between the MOS structure 8 and the emitter terminal 2, and an n$^+$-doped semiconductor region 21 is provided within the p-doped emitter zone 5, which semiconductor region directly adjoins the emitter terminal 2, but is at a distance from a channel (not shown here) that can be induced by the MOS structure 8 within the emitter zone 5. Furthermore, a p$^+$-doped semiconductor region 22 is provided, which likewise adjoins the emitter terminal 2, is arranged below the semiconductor region 21 and projects beyond the latter in the lateral direction. The semiconductor region 21 serves for feeding an electron current coming from the MOS channel to the emitter terminal 2, while the semiconductor region 22 serves for feeding a hole current to the emitter terminal 2 during commutation of the power diode 33.

Figure 7:
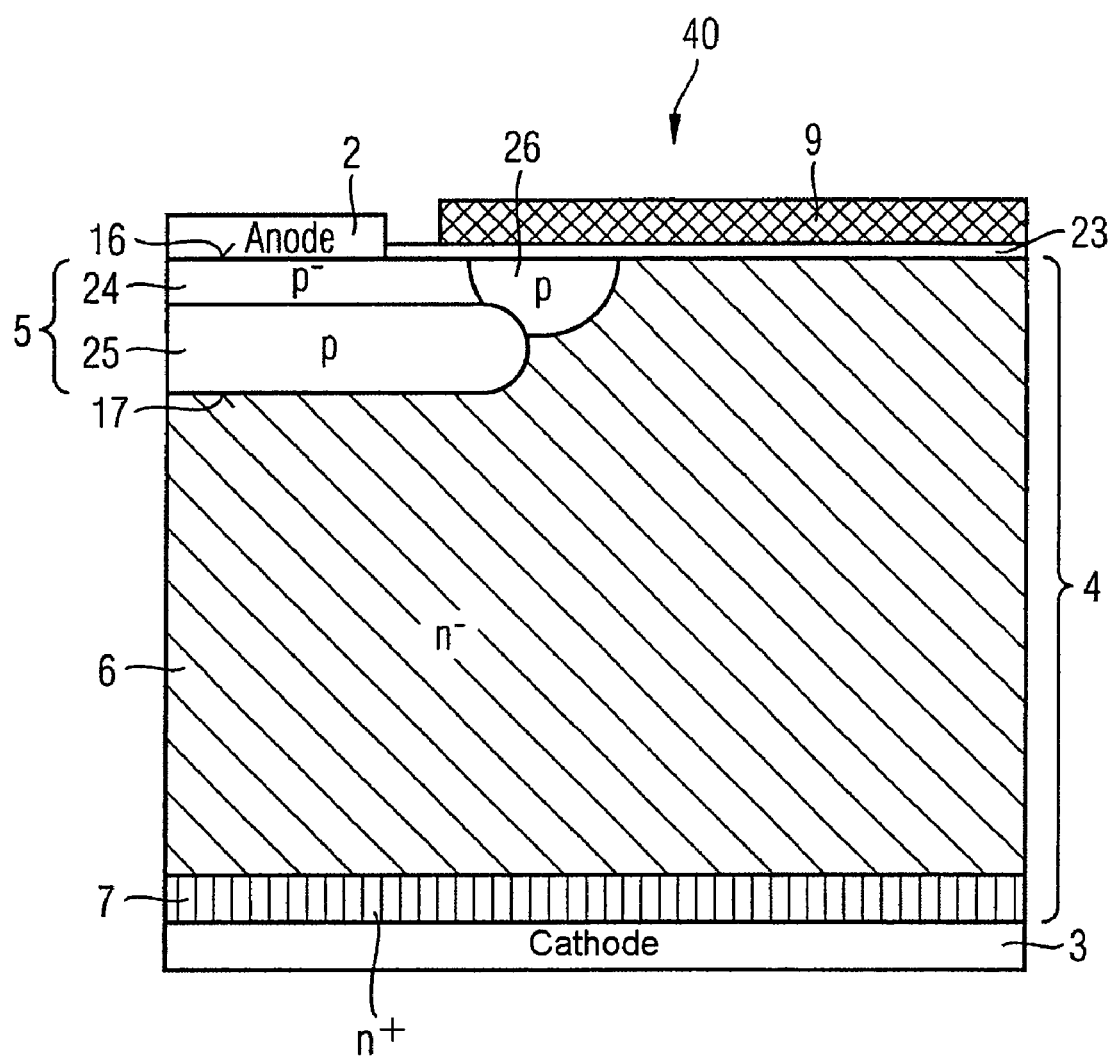
FIG. 7 shows a fourth embodiment of the semiconductor device according to the invention in a cross-sectional illustration.

FIG. 7 shows a power diode 40, the gate 9 of which is not arranged within a trench but rather is formed above the semiconductor body 4 and extends in the lateral direction. The gate 9 is insulated from the semiconductor body by means of an insulation layer 23. The emitter zone 5 is composed of a p$^-$-doped region 24 and two p-doped regions 25, 26. In this case, too, a MOS channel produced by the gate 9 within the p$^-$-type region 24 and the p-type region 26 (not shown) does not extend directly to the emitter terminal 2. The MOS channel has a lateral orientation in this embodiment, whereas the overall construction of the power diode 40 has a vertical construction.

Figure 8:
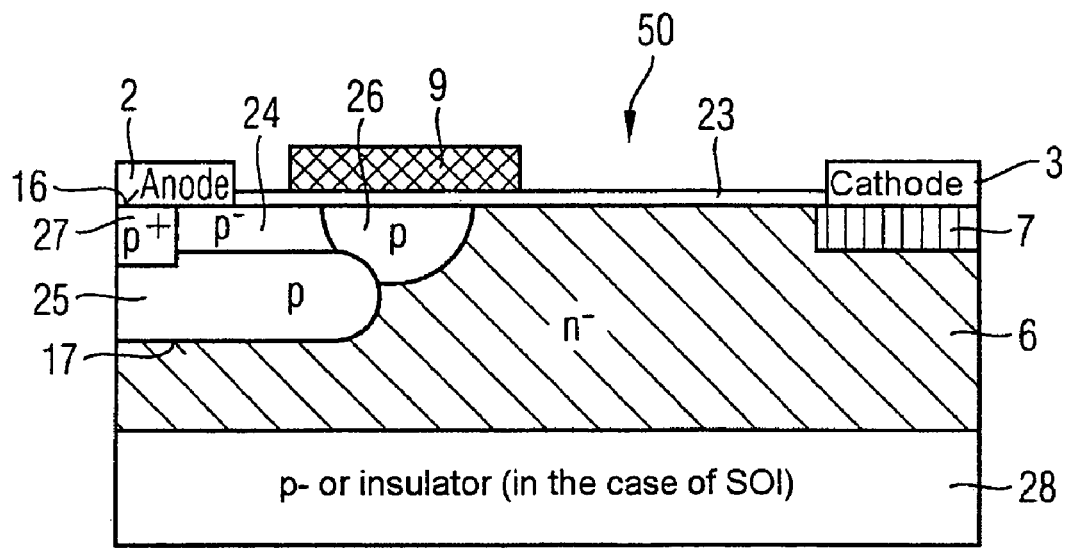
FIG. 8 shows a fifth embodiment of the semiconductor device according to the invention in a cross-sectional illustration.

The power diode 50 shown in FIG. 8 differs from the power diode 40 shown in FIG. 7 to the effect that the overall construction of the power diode 50 is lateral. Since the overall construction is of a lateral nature, a substrate (p$^-$-doped or an insulator (SOI Semiconductor On Insulator)) 28 is arranged below the drift region 6.

Figure 9:
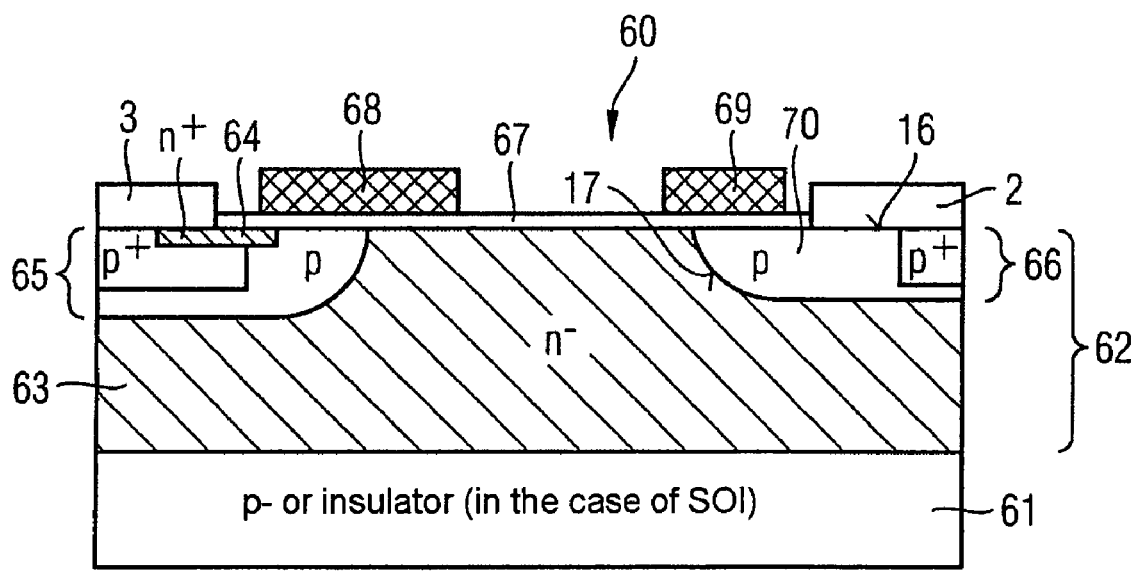
FIG. 9 shows a sixth embodiment of the semiconductor device according to the invention in a cross-sectional illustration.

FIG. 9 shows that the principle according to the invention (spacing apart the MOS channels from the emitter terminal) can also be applied to semiconductor devices other than power diodes. Thus, FIG. 9 shows an IGBT (Insulated Gate Bipolar Transistor) semiconductor device 60 having a lateral overall construction. The IGBT 60 has a substrate 61, on which a semiconductor body 62 is provided. A drift region 63, a source region 64, a body region 65 and also an emitter zone 66 are provided in the semiconductor body 62. The surface of the semiconductor body 62 is covered with an insulation layer 67, on which a first gate 68 and a second gate 69 are in turn provided. The first gate 68 serves for generating a current flow from the source region 64 through the body region 65 into the drift region 63. The second gate 69 corresponds to the gate 9 of the previously described embodiments. The efficiency of the emitter zone 66 (more precisely the efficiency of the p-doped region 70) can be set by way of the gate 69. For this purpose, a MOS channel is produced in the semiconductor region 70 by the second gate 69, the channel induced by the gate 69 being at a distance with respect to the collector terminal 3.

Figure 10:
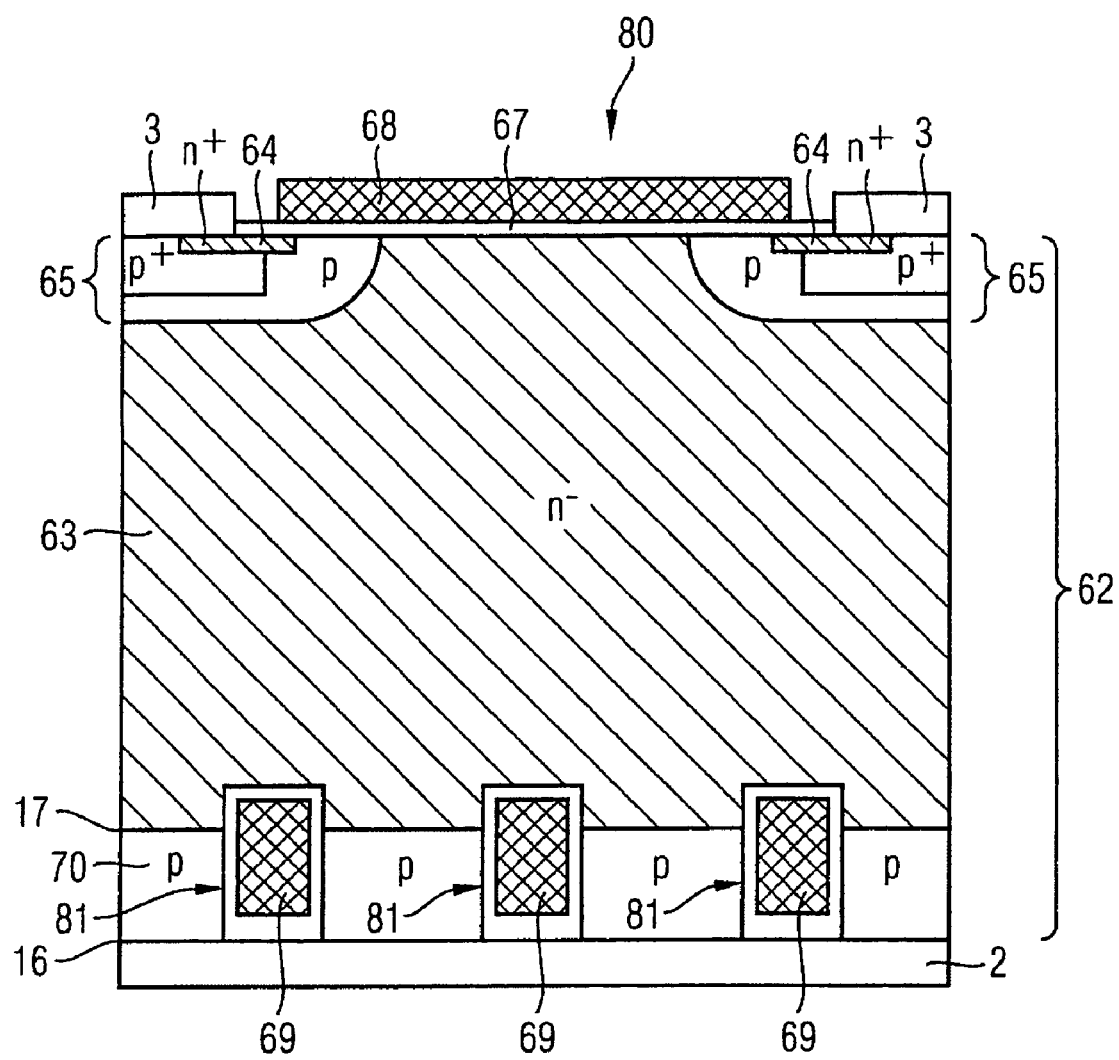
FIG. 10 shows a seventh embodiment of the semiconductor device according to the invention in a cross-sectional illustration.

FIG. 10 shows an IGBT semiconductor device 80, having a vertical overall construction in contrast to the IGBT semiconductor device 60 shown in FIG. 9. Thus, in this embodiment, the semiconductor region 70 (emitter zone) is arranged near to the rear side of the IGBT semiconductor device 80 and is pervaded by a plurality of MOS structures 81. The latter each have a gate 69 and also insulation layers 81 which electrically insulate the gates 69 from the semiconductor body 62. By means of the MOS structures, MOS channels can be induced within the semiconductor region 70 (the p-doped emitter zone) the channels (not shown here) being at a distance with respect to the emitter terminal 2.

Further aspects of the invention will be discussed in the description below.

As has already been indicated, in the case of power diodes (PIN diodes), the forward voltage is lower, the higher the charge carrier flooding in the lightly doped central region. During commutation, on the other hand, a high charge carrier flooding leads to an undesirably high reverse current which leads to increased switching losses on the one hand in the diode itself but also, in some cases, in other components (for instance in a half-bridge in the switching-on transistor or IGBT). The semiconductor device according to the invention demonstrates a possibility for enabling this increased reverse current to be avoided. The semiconductor device according to the invention is additionally robust with respect to the commutation of overcurrent since the switching on of parasitic bipolar transistors, which can destroy the components, is prevented.

The document DE 100 48 857 A1 (FIGS. 9, 10) specifies components in which the emitter efficiency, e.g. of the p-type emitter of a diode, can be reduced by switching on an n-MOS channel. This MOS channel gives the electrons coming from the rear side the opportunity to flow away through a region having low p-doping via the MOS channel to an n$^+$-type region connected to the anode (front-side contact). The region having a low p-type doping has only a poor emitter efficiency, for which reason the charge carrier flooding is low. If the MOS channel is switched off, the electrons have to flow through a p-type region having a higher doping, for which reason the emitter efficiency and hence the charge carrier flooding are correspondingly higher.

During the operation of components of this type, the MOS channel is switched off in the forward state (high charge carrier flooding), but switched on shortly before the commutation, so that the charge carrier flooding can be reduced and the reverse current remains low. What is disadvantageous about this structure is that, during commutation, the pn junction between the $n^+$-type region and the p-type region is forward-biased, as a result of which the parasitic npn transistor comprising the $n^+$-type region, the p-type emitter and the $n^-$-type region of the cathode can switch on and destroy the component.

The document DE 100 07 416 C1 (FIG. 2) describes a structure in which the electrons can reach an NMOS transistor via a Shottky contact and in turn an anode contact via said transistor. A similar effect to that described above can thus be obtained. The more complicated production of components of this type and also the existence of parasitic npn transistors are disadvantageous in this case.

The document U.S. Pat. No. 5,430,323 achieves the opposite effect, namely that a PIN diode can be connected in parallel with a Shottky diode via a PMOS transistor.

The document EP 0 564 094 B1 (FIG. 2) shows a structure which can likewise be operated in a manner similar to that in DE 100 48 857 A1. In this case, the gate is arranged in the trench; moreover, anode and cathode are interchanged relative to DE 100 48 857 A1. The MOS channel is therefore a p-channel instead of an n-channel. The structure thus contains a parasitic pnp transistor.

The invention, likewise a component comprising three terminals, solves the problem in a first exemplary embodiment (FIG. 1) by virtue of the fact that one or more gates that can induce n-conducting channels are arranged in the anode region, e.g. in trenches. Said channels may start on the cathode side in the $n^-$-type region and end on the anode side within the anode p-type region. An $n^+$-type region can be completely dispensed with in this case. The advantage of the structure is that the effects described in DE 100 48 857 A1 can be achieved, but no parasitic npn transistor is present.

FIG. 2 shows the charge carrier distributions with the gate switched on and off for a structure of this type. The MOS channel may also run completely within the anode p-type region (FIG. 3).

What is important for good functioning of the component is that the MOS channel bridges a largest possible proportion of the p-type doping. If M1 designates the lowest integral of the p-type doping over possible parts of the electrons from the $n^-$type region as far as the anode contact and M2 designates the lowest integral of the p-type doping over possible paths of the electrons from the $n^-$-type region as far as the beginning of the channel and further from the end of the MOS channel as far as the anode contact (see illustration in FIGS. 4a, 4b), then M2 should be less than half, better only a fifth, of M1. In this respect it is advantageous if the maximum of the p-doping lies in the region of the MOS channel and not in the region between MOS channel and anode contact (FIG. 5).

The trench width may be e.g. approximately 1 μm, the depth may be between approximately 2 μm and 8 μm, and the distance between two trenches may be between 2 μm and 10 μm or more.

The invention is not restricted to diodes, rather with corresponding structures the emitter of other bipolar components such as IGBT, thyristor, GTO, EST or MCT may be controlled as well, which of course respectively requires an additional gate terminal here as well.

An essential aspect of the invention is the use of a structure which, although it can conduct the electrons past the p-type region acting as p-type emitter largely through a MOS channel does not conduct the electrons directly into an $n^+$-type region. Instead, the electrons still have to diffuse from the end of the MOS channel as far as the anode contact (or to an $n^+$-type region connected to the latter) for a portion as minority charge carriers (holds true analogously for an n-type emitter). In the opposite direction, therefore, no electron current can flow, which makes the component very robust towards overcurrent.

The semiconductor device according to the invention should be used as follows: in the on state of the diode, the gate is switched off (high charge carrier flooding), but is switched on shortly before the commutation, so that the charge carrier flooding can be reduced and the reverse current remains low.

LIST OF REFERENCE SYMBOLS

1 Power diode
2 Emitter terminal
3 Collector terminal
4 Semiconductor body
5 Emitter zone
6 Drift region
7 $n^+$-doped region
8 MOS structure
9 Gate
10 Insulation layer
11 MOS channel
12 Channel end
13 Insulation layer
14 MOS channel
15 Channel end
16 First interface
17 Second interface
18 Integration path
19 Integration path
20 Power diode
A1, A2, A3 Distance
21 $n^+$-doped region
22 $p^+$-doped region
23 Insulation layer
24 $p^-$-doped region
25 p-type region
26 p-type region
27 $p^+$-type region
28 Substrate
30 Power diode
40 Power diode
50 Power diode
60 IGBT device
61 Substrate
62 Semiconductor body
63 Drift region
64 Source region
65 Body region
66 Collector region
67 Insulation layer
68 First gate
69 Second gate
70 Semiconductor region
80 IGBT device
81 MOS structure

The invention claimed is:

1. A semiconductor device, comprising:
an emitter terminal,
a collector terminal,
a semiconductor body provided between emitter terminal and collector terminal, and
an emitter zone of a first conductivity type, which is formed in the semiconductor body and has a first interface facing the emitter terminal and a second interface facing the collector terminal, the second interface adjoining a drift region formed in the semiconductor body between the emitter terminal and the collector terminal,
wherein at least one MOS structure pervades the emitter zone, adjoins the emitter zone between the first interface and the second interface, and is configured such that corresponding MOS channels induced by the MOS structure within the emitter zone are at a distance from the first interface of the emitter zone, and
wherein a dopant concentration within the MOS channels is higher than a dopant concentration in the emitter zone between the first interface of the emitter zone and the end sections of the MOS channels that face the first interface.

2. The semiconductor device according to claim 1 wherein the semiconductor device has a vertical or horizontal construction.

3. The semiconductor device according to claim 1, wherein the MOS channels have a vertical orientation.

4. The semiconductor device according to claim 1, wherein the semiconductor device is a diode, an IGBT, a thyristor, a GTO, an EST or an MCT.

5. A semiconductor device, comprising:
an emitter terminal,
a collector terminal,
a semiconductor body disposed between emitter terminal and collector terminal, and
an emitter zone of a first conductivity type disposed within the semiconductor body and having a first interface facing the emitter terminal and a second interface facing the collector terminal, the first interface adjoining the emitter terminal and the second interface adjoining a drift region formed in the semiconductor body between the emitter zone and the collector terminal,
at least one MOS structure extending at least into the emitter zone and adjoining the latter between the first interface and the second interface is configured such that corresponding MOS channels induced by the MOS structure within the emitter zone are at a distance from the first interface of the emitter zone, and
a dopant concentration within the MOS channels is higher than a dopant concentration between the first interface of the emitter zone and the end sections of the MOS channels that face the first interface.

6. The semiconductor device according to claim 5, wherein the semiconductor device has a vertical or horizontal construction.

7. The semiconductor device according to claim 5, wherein the MOS channels have a vertical orientation.

* * * * *